US011150133B2

(12) United States Patent
Stojkovic et al.

(10) Patent No.: US 11,150,133 B2
(45) Date of Patent: Oct. 19, 2021

(54) GAIN CORRECTION IN SIGNAL PROCESSING CIRCUITRY

(71) Applicant: ams Sensors Germany GmbH, Jena (DE)

(72) Inventors: Dalibor Stojkovic, Erfurt (DE); Predrag Micakovic, Erfurt (DE)

(73) Assignee: ams Sensors Germany GmbH, Jena (DE)

( * ) Notice: Subject to any disclaimer, the term of this patent is extended or adjusted under 35 U.S.C. 154(b) by 29 days.

(21) Appl. No.: 16/834,477

(22) Filed: Mar. 30, 2020

(65) Prior Publication Data

US 2020/0225091 A1 Jul. 16, 2020

Related U.S. Application Data

(63) Continuation-in-part of application No. PCT/EP2019/082480, filed on Nov. 25, 2019.

(60) Provisional application No. 62/825,151, filed on Mar. 28, 2019, provisional application No. 62/785,469, filed on Dec. 27, 2018.

(51) Int. Cl.
| | |
|---|---|
| *H03M 1/06* | (2006.01) |
| *G01J 3/28* | (2006.01) |
| *G01J 3/26* | (2006.01) |
| *G01J 3/02* | (2006.01) |

(52) U.S. Cl.
CPC . *G01J 3/28* (2013.01); *G01J 3/02* (2013.01); *G01J 3/26* (2013.01); *H03M 1/06* (2013.01)

(58) Field of Classification Search
CPC .......... G01J 3/28; G01J 2001/444; G01J 1/46; G01J 3/0264; G01J 2003/2869; H03M 1/06; H03M 1/12; H03M 3/30; H03M 1/0609; G01N 21/8851; G01N 2021/8896; G01N 21/274

See application file for complete search history.

(56) References Cited

U.S. PATENT DOCUMENTS

| | | | |
|---|---|---|---|
| 5,514,865 A | 5/1996 | O'Neil | |
| 2005/0052296 A1* | 3/2005 | Manlove | H03F 3/45973 341/110 |

FOREIGN PATENT DOCUMENTS

WO 2014097747 A1 6/2014

OTHER PUBLICATIONS

International Search Report for Application No. PCT/EP2019/082480 dated Mar. 13, 2020 (5 pages).

(Continued)

*Primary Examiner* — Abdullahi Nur
(74) *Attorney, Agent, or Firm* — Michael Best and Friedrich LLP (57) ABSTRACT

A method of processing an analog signal includes receiving, into signal processing circuitry from compensation circuitry, an offset compensation signal, the offset compensation signal having (i) a polarity opposite a polarity of a gain error of the signal processing circuitry and (ii) a magnitude equal to a nominal compensation value plus a deviation. The method includes generating, by the signal processing circuitry, an output signal based on an analog signal received into the signal processing circuitry, including applying the offset compensation signal to an intermediate signal generated by the signal processing circuitry. The method includes scaling the output signal based on the deviation between the magnitude of the offset compensation signal and the nominal compensation value.

21 Claims, 6 Drawing Sheets

(56) References Cited

OTHER PUBLICATIONS

Ignjatovic et al., "Low Power, High Dynamic Range CMOS Image Sensor Employing Pixel-Level Oversampling Σ Δ Analog-to-Digital Conversion", IEEE Sensors Journal, vol. 12, No. 4, 2012, pp. 737-746.

Singh et al., "A CMOS Σ-Δ Photodetector Array for Bioluminescence-Based DNA Sequencing", Symposium on VLSI Circuits Digest of Technical Papers, 2011, pp. 96-97.

* cited by examiner

GAIN CORRECTION IN SIGNAL PROCESSING CIRCUITRY

RELATED APPLICATIONS

This application claims priority to U.S. Provisional Patent Application No. 62/825,151, filed Mar. 28, 2019, the entire contents of which is incorporated herein by reference. This application claims priority as a continuation-in-part of PCT Patent Application No. PCT/EP2019/082480, filed Nov. 25, 2019, which claims priority to U.S. Provisional Patent Application No. 62/785,469, filed Dec. 27, 2018, the entire contents of both of which are incorporated herein by reference.

FIELD

Analog circuits, such as circuitry for processing sensor signals such as photodetector signals, can be used in connection with digital-to-analog control, e.g., to improve accuracy and precision of the sensing technology.

SUMMARY

In an aspect, a method of processing an analog signal includes receiving, into signal processing circuitry from compensation circuitry, an offset compensation signal, the offset compensation signal having (i) a polarity opposite a polarity of a gain error of the signal processing circuitry and (ii) a magnitude equal to a nominal compensation value plus a deviation. The method includes generating, by the signal processing circuitry, an output signal based on an analog signal received into the signal processing circuitry, including applying the offset compensation signal to an intermediate signal generated by the signal processing circuitry. The method includes scaling the output signal based on the deviation between the magnitude of the offset compensation signal and the nominal compensation value.

Embodiments can include one or more of the following features.

Scaling the digital signal includes scaling the output signal based on the deviation and on a gain error coefficient of the signal processing circuitry. The gain error coefficient of the signal processing circuitry includes a ratio between a resolution limit of the signal processing circuitry and a gain of the signal processing circuitry. The method includes determining the gain error coefficient of the compensation circuitry. The method includes determining the gain error coefficient using a lookup table relating gain error coefficients to corresponding gains of the signal processing circuitry. The method includes determining the gain error coefficient by a measurement.

The method includes determining the deviation between the magnitude of the offset compensation signal and the nominal compensation value. The method includes determining the deviation between the magnitude of the offset compensation signal and the nominal compensation value based on previous offset compensation signals received from the compensation circuitry. The method includes determining the deviation based on an average of the previous offset compensation signals.

Receiving an analog signal into signal processing circuitry includes receiving the analog signal into an analog-to-digital converter.

Receiving an analog signal into the signal processing circuitry includes receiving the analog signal into a delta sigma modulator.

Receiving an analog signal includes receiving the analog signal from a photodetector.

Receiving an offset compensation signal from compensation circuitry includes receiving the offset compensation signal from a digital to analog converter (DAC).

The deviation of the offset compensation signal is a positive or negative integer multiple of a resolution limit of the signal processing circuitry.

The deviation of the offset compensation signal is +1 least significant bit (LSB) of the signal processing circuitry, 0, or −1 LSB.

The method includes performing a spectral analysis based on the scaled output signal.

In an aspect, a system for processing an analog signal includes signal processing circuitry having a gain error. The system includes compensation circuitry configured to provide an offset compensation signal to the signal processing circuitry, the offset compensation signal having (i) a polarity opposite a polarity of the gain error of the signal processing circuitry and (ii) a magnitude equal to a nominal compensation value plus a deviation. The signal processing circuitry is configured to generate an output signal based on a received analog signal, including applying the offset compensation signal to an intermediate signal generated by the signal processing circuitry. The system includes one or more processors coupled to a memory, the one or more processors and memory configured to scale the output signal from the signal processing circuitry based on the deviation between the magnitude of the offset compensation signal and the nominal compensation value.

Embodiments can include one or more of the following features.

The one or more processors and memory are configured to scale the output signal based on the deviation and on a gain error coefficient of the compensation circuitry. The gain error coefficient of the compensation circuitry includes a ratio between a resolution limit of the signal processing circuitry and a gain of the signal processing circuitry. The one or more processors and memory are configured to determine the gain error coefficient of the compensation circuitry. The one or more processors and memory are configured to determine the gain error coefficient using a lookup table relating gain error coefficients to corresponding gains of the signal processing circuitry. The one or more processors and memory are configured to determine the gain error coefficient by a measurement.

The one or more processors and memory are configured to determine the deviation between the magnitude of the offset compensation signal and the nominal compensation value.

The signal processing circuitry includes an analog-to-digital converter.

The signal processing circuitry includes an amplifier.

The signal processing circuitry includes a delta sigma modulator.

The system includes the sensor. The sensor includes a photodetector.

The compensation circuitry includes a digital to analog converter (DAC).

In an aspect, a system for performing spectral analysis includes a photodetector configured to output an analog signal responsive to receipt of an optical signal. The system includes a signal processing module including signal processing circuitry having a gain error; and compensation circuitry configured to provide an offset compensation signal to the signal processing circuitry, the offset compensation signal having (i) a polarity opposite a polarity of the gain error of the signal processing circuitry and (ii) a magnitude equal to a nominal compensation value plus a deviation. The signal processing circuitry is configured to generate an output signal based on a received analog signal, including applying the offset compensation signal to an intermediate signal generated by the signal processing circuitry. The system includes one or more processors coupled to a memory, the one or more processors and memory configured to scale the output signal from the signal processing circuitry based on the deviation between the magnitude of the offset compensation signal and the nominal compensation value; and perform a spectral analysis based on the output signal.

Embodiments can include one or more of the following features.

Performing a spectral analysis includes performing an ambient color measurement.

The system includes a smart lighting system.

The system includes an agricultural analysis system.

The system includes a fluid analysis system.

The system includes a medical analysis system.

DETAILED DESCRIPTION

Figure 1:
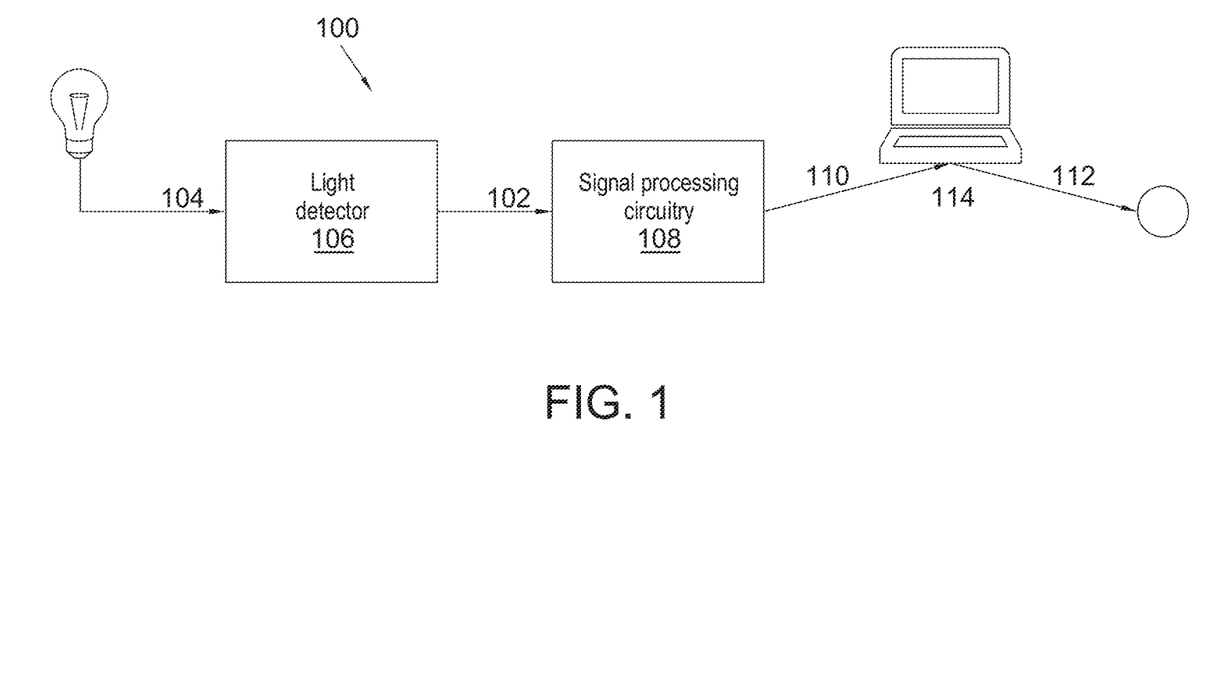
FIG. 1 is a diagram of a light detector assembly.

Referring to FIG. 1, a light detector assembly 100 processes an analog signal 102 that is generated by a light detector 106, such as a photodiode, based on light 104 detected by the light detector 106. The light detector assembly 100 can be implemented as part of a computing device, such as a computer, a microcontroller, or another device capable of data processing functionality. Signal processing circuitry 108 of the light detector assembly 100, such as an analog-to-digital converter (ADC), processes the analog signal 102, e.g., converting the analog signal 102 to an output signal 110, such as a digital signal. The resolution of the signal processing circuitry 108 limits the magnitude of the analog signals 102 that can be resolved by the light detector assembly 100, e.g., the level of light 104 that can be detected. Signal processing circuitry 108 with high resolution enables the detection of very low levels of light. We describe here an approach to correction of a gain in the signal processing circuitry 108 such that the resolution of the signal processing circuitry 108 can be enhanced, thus enabling the detection of smaller signals, e.g., lower levels of light. For instance, one or more processors 114 can determine and apply a gain correction to the output signal 110, generating a corrected output signal 112 having higher resolution than the output signal 110.

Signal processing circuitry, such as an ADC, can implement an auto-zero function that reduces or removes the presence of dark current from the output signal of the ADC. The gain correction approaches described here further remove resolution error from the auto-zero function. These approaches can be useful for area optimization, e.g., for digitally assisted analog parts, such as photodiodes. These approaches can be useful for further reducing dark current, e.g., by reducing the bias voltage of a photodiode to close to zero. These approaches can be useful for reducing gain error, e.g., by reducing the virtual ground of an integrator to close to zero. These approaches can help reduce or eliminate the temperature dependence of dark current (sometimes referred to as an ADC offset) or the temperature dependence of ADC gain. These approaches can also help to improve the signal to noise ratio of an ADC in applications used in wide temperature ranges.

Figure 2A:
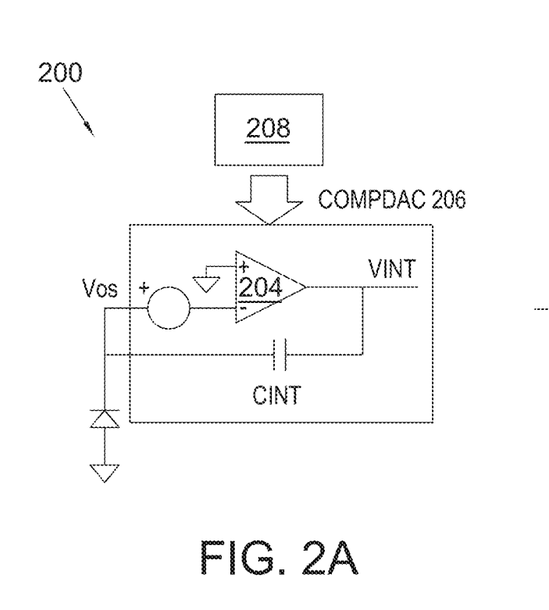
FIG. 2A is a diagram of an integrator.

FIG. 2A shows an example of an integrator 200 of a first-order delta-sigma modulator 200 of an ADC, the integrator 200 implemented by an operational amplifier (OPAMP) 204. The integrator 200 can form part of an ADC for converting an analog signal, e.g., from a light detector, into a digital signal. The integrator 200 receives an offset voltage, $V_{OS}$, at a first terminal of the OPAMP 204 and outputs an output signal $V_{INT}$. A feedback loop of the integrator 200 provides a capacitance of $C_{INT}$.

The offset voltage $V_{OS}$ can exhibit fluctuations, e.g., due to variability in the source of the offset voltage. Fluctuations of the offset voltage $V_{OS}$ can also be introduced by temperature drift, e.g., caused by ambient heat or by self-heating effects, such as heat generated by the operation of other electronic components such as light sources or microcontrollers. The fluctuations in the offset voltage can cause a dark current signal on the output signal $V_{INT}$. A dark current signal is the presence of a residual current in a device in which no voltage is applied, e.g., when there is no incident light illuminating the light detector connected to the integrator 200. Dark current can introduce noise into the operation of the integrator 200, degrading the signal-to-noise ratio of the delta-sigma modulator and introducing gain and offset error to ADC characteristics.

The fluctuations in the offset voltage $V_{OS}$ can be addressed by applying a compensation signal 206, such as a compensation voltage COMPDAC, to the offset voltage $V_{OS}$ of the integrator 200. For instance, the compensation signal 206 can be generated by compensation circuitry 208 such as a digital-to-analog converter (DAC). ompensation for the dark current can also include approaches such as algorithmic approaches, e.g., a successive-approximation-register (SAR) ADC, a linear ramp, or another approach. These approaches are collectively referred to as auto-zero (AZ) operations.

Figure 2B:
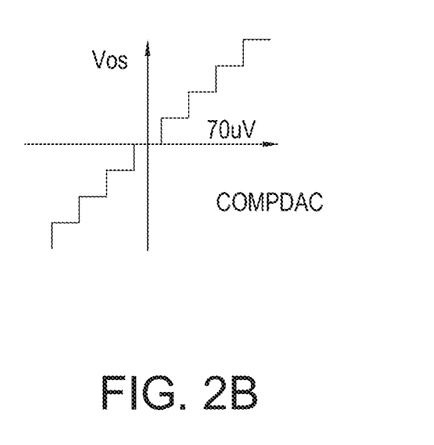
FIG. 2B is a plot of a relationship between offset voltage and digital compensation value for an integrator.

Complete compensation for the fluctuations in the offset voltage $V_{OS}$ would eliminate the dark current signal. However, the compensation circuitry 208, e.g., the DAC, has a resolution limit that causes the compensation voltage COMPDAC to be quantized in units equal to the resolution limit of the compensation circuitry 208. The quantization of the COMPDAC voltage results in quantization of the compensation for the fluctuations in the offset voltage $V_{OS}$, as shown in FIG. 2B. Because this quantization of the compensation voltage is predictable (e.g., the compensation voltage is quantized by known, discrete amounts), the effect of the quantization of the compensation voltage can itself be addressed (e.g., the quantization can be removed), as discussed in more detail below, thereby enabling further enhancement of the resolution of the signal.

When a sensor, such as a light detector, provides an analog signal to the delta-sigma modulator, the analog signal is processed in part by a comparison with the offset voltage $V_{OS}$. When the quantization of the COMPDAC voltage, and thus the quantization of the compensation for the fluctuations in the offset voltage $V_{OS}$, exceeds the magnitude of the signal from the sensor, that signal cannot be resolved in the output from the integrator 200. This means that small sensor signals are lost in the signal-to-noise ratio that results, at least in part, from the quantization of the COMPDAC voltage. For instance, in the example of FIG. 2B, the resolution of the compensation circuitry 208, and accordingly the quantization of the COMPDAC voltage, is 70 µV, meaning that sensor signals having a voltage of less than 70 µV cannot be resolved by the integrator 200.

Figure 3:
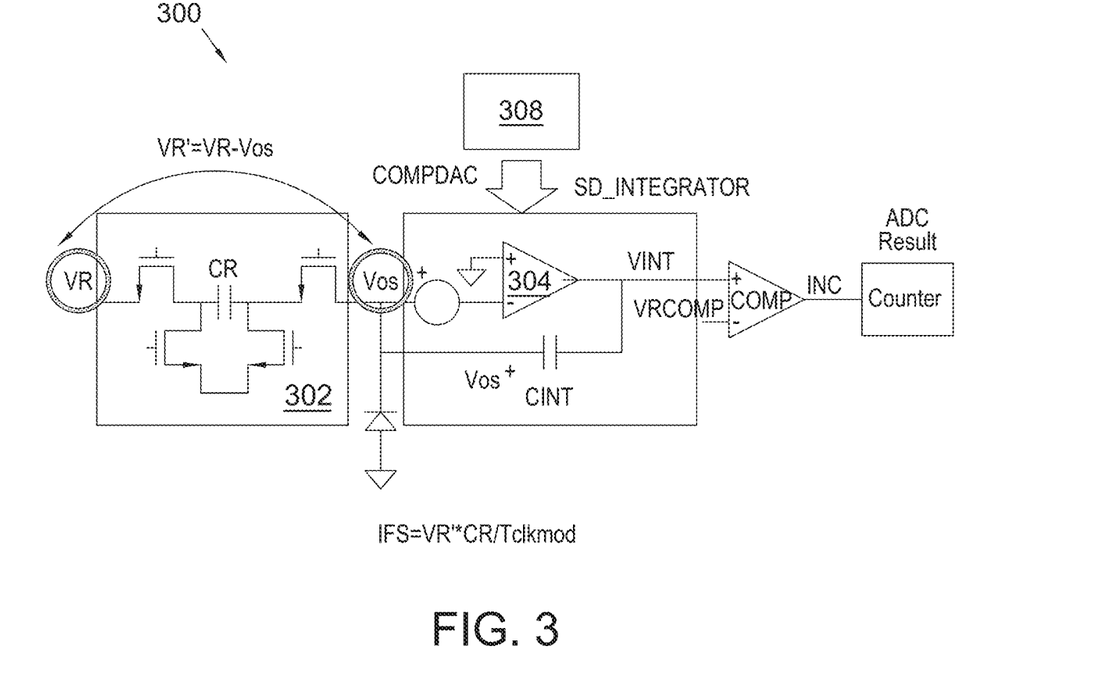
FIG. 3 is a diagram of a first-order delta-sigma modulator.

Referring to FIG. 3, in some examples, a first order delta-sigma modulator 300 can be used for analog signal processing of a sensor signal, e.g., for light-to-frequency (LTF) conversion applications. The delta-sigma modulator 300 includes an integrator implemented by an operational amplifier (OPAMP) 304, similar to the delta-sigma modulator 200 of FIG. 2A. The delta-sigma modulator 300 receives an offset voltage, $V_{OS}$, at a first terminal of the OPAMP 304 and outputs an output signal $V_{INT}$. A feedback loop of the delta-sigma modulator 300 provides a capacitance of $C_{INT}$. The delta-sigma modulator 300 also includes reference circuitry 302 that provide a reference voltage $V_R$ (also referred to as a gain) and reference capacitance $C_R$ to generate a charge equal to the input current from the sensor. For instance, the integrator reset phase is used to define initial conditions where the output signal $V_{INT}$ is regulated close to the reference voltage $V_R$.

The full scale current $I_{FS}$ of the delta-sigma modulator is defined as $$I_{FS} = \frac{V'_R * C_R}{t_{clock\_mod}}, \quad (1)$$

where $t_{clock\_mod}$ is the clock time from the delta-sigma modulator and $$V'_R = V_R - V_{OS}. \quad (2)$$

$V_R$ is the reference voltage and $V_{OS}$ is the offset voltage of the OPAMP 304. Because of the resolution limit of the DAC 308, there remains some uncompensated offset voltage $V_{OS}$ on the virtual ground, resulting in gain error for the delta-sigma modulator 300. This situation can be expressed by the following equation:

$$I_{FS} = \frac{(V_R - V_{OS}) * C_R}{t_{clock_{mod}}} = \frac{V_R * C_R}{t_{clock_{mod}}}\left(1 - \frac{V_{OS}}{V_R}\right). \quad (3)$$

As noted above, to address fluctuations in the offset voltage, e.g., due to source variability, thermal drift, or both, an auto-zero operation can be applied to introduce a compensation voltage of value AZ onto the input of the OPAMP 304. However, the value of the compensation voltage itself can also be subject to fluctuations, e.g., of ±1 LSB (e.g., ±70 µV), where LSB is the least significant bit of the measured voltage value. In terms of the applied compensation voltage AZ and a nominal value $AZ_0$ of the compensation voltage, Equation (3) above can be expressed as follows:

$$I_{FS} = I_{FS0}\left(1 - \frac{V_{OS_{LSB}}}{V_R} * (AZ - AZ_0)\right), \quad (4)$$

where $I_{FS}$ is the ideal gain such that $V_{OS}=0$.

Figure 4:
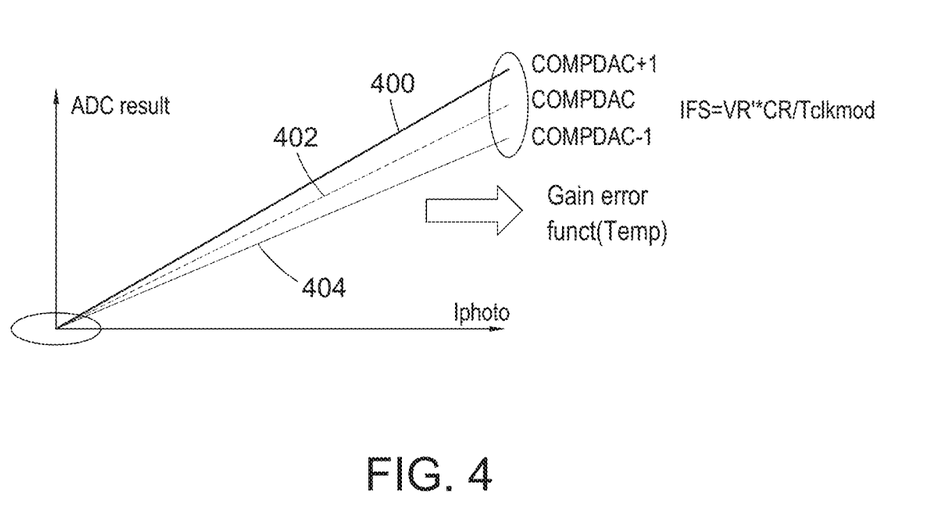
FIG. 4 is a plot of operating characteristics of a delta-sigma modulator.

Referring to FIG. 4, the ±1 LSB fluctuation of the applied compensation voltage causes the delta-sigma modulator 300 to operate with three distinct operating characteristics 400, 402, 404, depending on whether the applied value of the compensation voltage is shifted by +1 LSB relative to the nominal compensation voltage, not shifted, or shifted by −1 LSB relative to the nominal compensation voltage. The characteristic 402 is the ideal operating characteristic; the characteristics 400, 404 have −1 LSB and +1 LSB error, respectively, resulting from the autozero operation. Moreover, because the fluctuation of the compensation voltage is stochastic, the operating characteristic of the delta-sigma modulator is different for each cycle of measurement. These per-cycle fluctuations manifest as noise in the relationship between the received sensor signal (e.g., photocurrent) and the signal output from the ADC, degrading the signal-to-noise ratio of the system. In some examples, such as for small photocurrents in which the signal is comparable to or smaller than the value of the fluctuation, the noise can overwhelm the signal.

The value of the compensation voltage can be stored by the DAC for each autozero operation (e.g., for each measurement cycle). Based on this value, it can be determined, for each measurement cycle, whether the fluctuation in the compensation voltage was +1 LSB, 0, or −1 LSB. To further compensate for these fluctuations in the compensation voltage, the measurement result can be scaled on a per-cycle basis based on the determined value of the fluctuation (e.g., based on whether the fluctuation was +1 LSB, 0, or −1 LSB). This scaling of the measurement result adjusts for the fluctuations in the compensation voltage, making the measurement stable across cycles and enhancing the signal-to-noise ratio.

The scaling of the measurement result can be performed according to the following equation:

$$ADATA_{COMP} = ADATA\left(1 - \frac{V_{OS_{LSB}}}{V_R} * (AZ - AZ_0)\right), \quad (5)$$

where ADATA is the unadjusted measurement result exhibiting compensation gain dependency, $ADATA_{COMP}$ is the corrected measurement result, AZ is the value of the compensation voltage for the particular measurement, and $AZ_0$ is the nominal value of the compensation voltage. This equation indicates that the scaling of the measurement result is performed based on the deviation between AZ and $AZ_0$ and on the ratio between $V_{OS_{LSB}}$ and $V_R$, e.g., the ratio between a resolution limit of the delta sigma converter and the gain of the delta sigma converter.

In some cases, such as an instances with a DAC with a precision greater than the LSB of the delta-sigma modulator, the nominal value $AZ_0$ can be determined by averaging the applied autozero values for multiple past measurements. In some examples, the nominal value of the compensation voltage, $AZ_0$, can be determined by starting the autozero operation before each measurement and storing the resulting AZ value actually applied to the series of measurements. The nominal value $AZ_0$ can then be estimated by averaging the applied AZ values across N measurements. In some examples, the nominal value $AZ_0$ can be obtained by starting N autozero operations before each measurement and estimating the nominal $AZ_0$ value by averaging the AZ values of those N autozero operations.

In some examples, the nominal value $AZ_0$ can be temperature dependent, e.g., with a linear dependence on temperature. When a value for $AZ_0$ is determined at a given temperature, the value for $AZ_0$ at a different temperature can be determined based on the relationship between $AZ_0$ and temperature, e.g., based on a linear relationship.

The value $$\frac{V_{OS_{LSB}}}{V_R}$$

is referred to as the autozero gain error coefficient $K_R$ and serves as a scaling factor. In some examples, $K_R$ can be determined by a lookup table, e.g., created by simulation, that maps values of the gain error coefficient ($K_R$) to corresponding values of the gain $V_R$. In some examples, $K_R$ can be determined by measurement. For instance, two different autozero values, AZ and AZ+1, can be applied at the same target, and $K_R$ can be determined by the following relationship:

$$K_R = \frac{ADATA(AZ_0 + 1)}{ADATA(AZ_0)} - 1. \tag{6}$$

Figure 5:
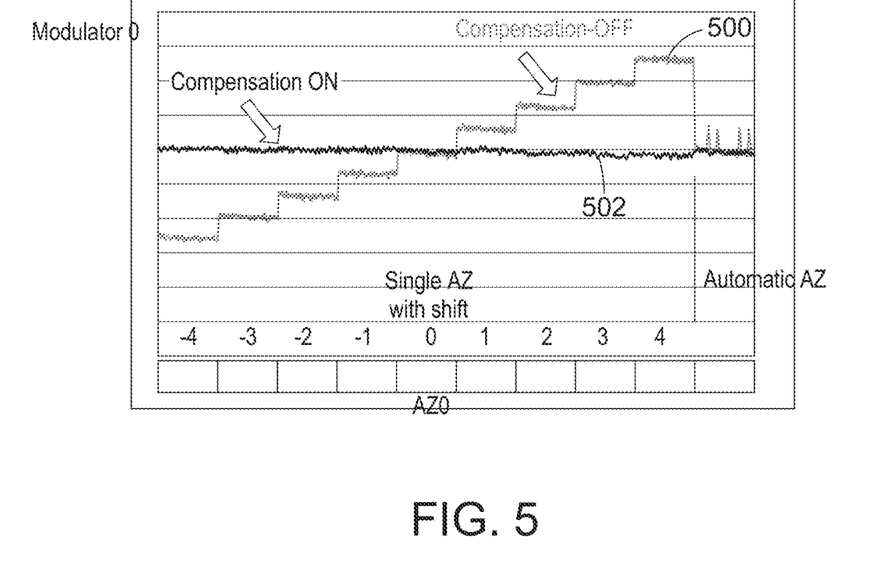
FIG. 5 is a plot of a measurement output.

FIG. 5 shows an example of a measurement output showing a step-like output 500 that occurs without the autozero compensation described here, and a substantially constant output 502 when the autozero compensation is applied. For highly sensitive systems, such as systems sensitive to picoAmperes or femtoAmperes of current, the elimination of the quantized output characteristic can enable accurate measurements of such systems with relatively low signal-to-noise ratios.

Figure 6A:
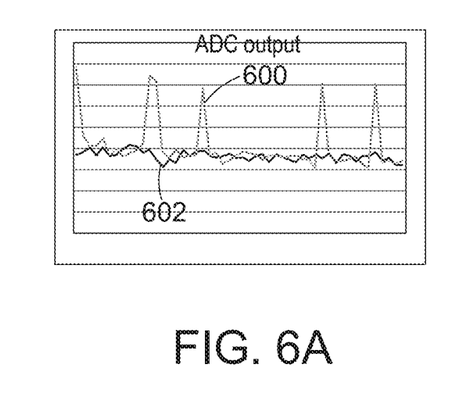
FIGS. 6A and 6B are plots of an output and a signal-to-noise ratio, respectively, of an analog-digital converter.
Figure 6B:
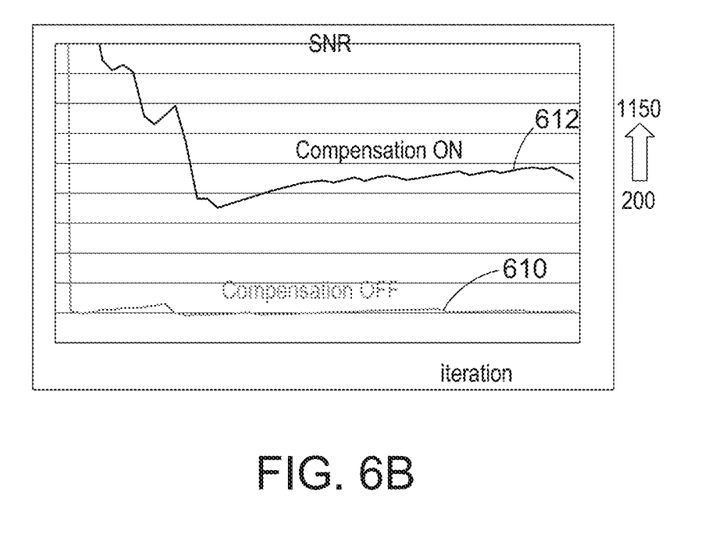

Referring to FIG. 6A, the output of the ADC, such as the delta-sigma modulator, is also smoother with the autozero compensation applied (curve 602). In contrast, without the application of autozero compensation (curve 600), noise occurs at autozero change events, which manifests as a spike in the ADC output. Referring also to FIG. 6B, the presence of noise can also be seen in the signal-to-noise ratio of the output without autozero compensation (curve 610), while the signal-to-noise ratio of the output with autozero compensation (curve 612) is significantly better.

In an example of the operation of a first order delta-sigma modulator using the autozero compensation approaches described here, an integrator reset phase is used to define initial conditions such that the $V_{INT}$ voltage is regulated close to the gain $V_R$. After the reset, a sensor, such as a photodiode, is connected, and continuous photocurrent integration is started on the $C_{INT}$ capacitance. The integrator output ramps linearly proportional to the input current. When a trip point (e.g., $V_R$) is reached, a negative step ($\Delta V_{INT} = V_R C_R / C_{INT}$) is generated at the integrator output.

This charge balancing feedback loop continues until a stopping point is reached, e.g., until a user programmed number of clock cycles has been reached. During this time, a count of COMP=1 is implemented to present the results of the ADC conversion. The full scale current in this example can be calculated as $I_{FS} = V_R C_R / t_{clock\_mod}$.

In some examples, the full scale current can be set based on the expected current of the signal to be generated by detection by the sensor. For instance, for a highly sensitive system in which the objective is detection of femtoAmperes of signal, the full scale current can be set to, e.g., 1 pA. To achieve a target full scale current, the $V_R$ and $C_R$ values can be specified. For instance, to obtain a full scale current of 1 pA, the $V_R$ value can be set to, e.g., between 5-10 mV.

Figure 7:
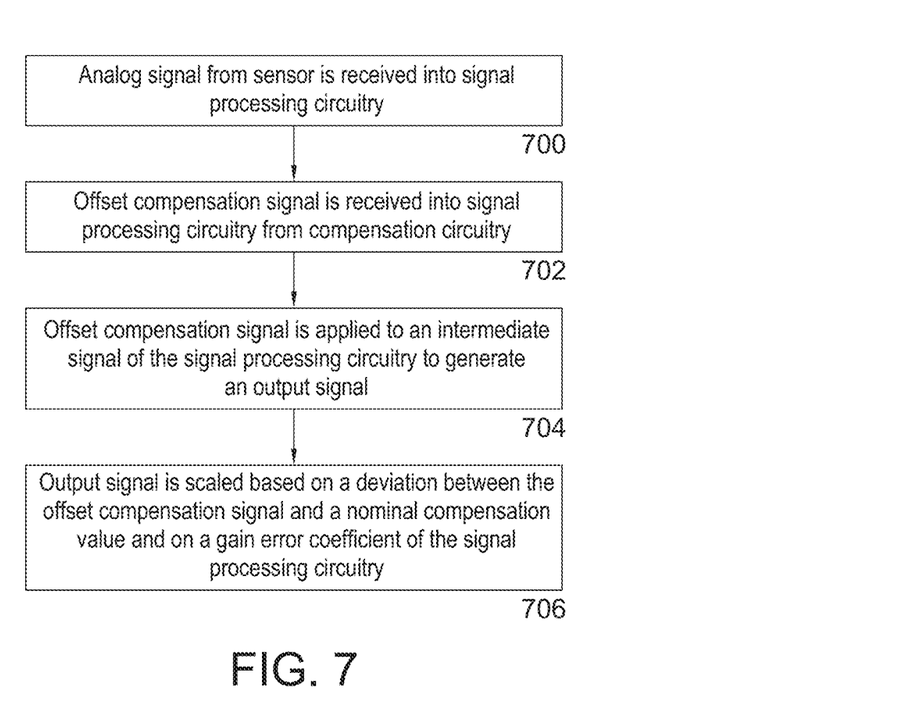
FIG. 7 is a flow chart.

Referring to FIG. 7, in an example approach to processing a signal, an analog signal from a sensor is received into signal processing circuitry, such as an ADC (700). For instance, the analog signal can be current from a photodetector. The signal processing circuitry has a gain error.

An offset compensation signal is received into the signal processing circuitry from compensation circuitry, such as a DAC (702). The offset compensation signal has a polarity opposite the polarity of the gain error of the signal processing circuitry, and a magnitude equal to a nominal compensation value plus a deviation.

The signal processing circuitry applies the offset compensation signal to an intermediate signal generated by the signal processing circuitry to generate an output signal (704).

The output signal is scaled based on the deviation between the offset compensation signal and the nominal compensation value (706) and on a gain error coefficient of the signal processing circuitry. For instance, the gain error coefficient can include a ratio between a resolution limit of the signal processing circuitry and a gain of the signal processing circuitry.

The approaches to autozero compensation described here can be used for performance enhancements in smart lighting applications. For instance, sensors for color measurement can incorporate these approaches to autozero compensation, e.g., for color measurement and balancing in home or building lighting, automotive lighting, or aviation lighting. The approaches to autozero compensation described here can be used for consumer or industrial spectral sensor applications, such as multi spectral sensing for color measurement with spectral reconstruction. The approaches to autozero compensation described here can be used for multi spectral sensing and analysis in fields such as agriculture, fluid analysis, or medical applications.

A number of embodiments have been described. Nevertheless, it will be understood that various modifications may be made without departing from the spirit and scope of the invention. For example, some of the steps described above may be order independent, and thus can be performed in an order different from that described.

Other implementations are also within the scope of the following claims.

What is claimed is:

1. A method of processing an analog signal, the method comprising:
   receiving, into signal processing circuitry from compensation circuitry, an offset compensation signal, the offset compensation signal having (i) a polarity opposite a polarity of a gain error of the signal processing circuitry and (ii) a magnitude equal to a nominal compensation value plus a deviation;
   generating, by the signal processing circuitry, an output signal based on an analog signal received into the signal processing circuitry, including applying the offset compensation signal to an intermediate signal generated by the signal processing circuitry; and
   scaling the output signal based on the deviation between the magnitude of the offset compensation signal and the nominal compensation value.

2. The method of claim 1, in which scaling the digital signal comprises scaling the output signal based on the deviation and on a gain error coefficient of the signal processing circuitry.

3. The method of claim 2, in which the gain error coefficient of the signal processing circuitry comprises a ratio between a resolution limit of the signal processing circuitry and a gain of the signal processing circuitry.

4. The method of claim 2, comprising determining the gain error coefficient of the compensation circuitry, optionally in which the gain error coefficient is determined:
  using a lookup table relating gain error coefficients to corresponding gains of the signal processing circuitry; and/or
  by a measurement.

5. The method of claim 1, comprising determining the deviation between the magnitude of the offset compensation signal and the nominal compensation value:
  based on previous offset compensation signals received from the compensation circuitry; and/or
  based on an average of the previous offset compensation signals.

6. The method of claim 1, in which receiving an analog signal into signal processing circuitry comprises receiving the analog signal into an analog-to-digital converter and/or a delta sigma modulator.

7. The method of claim 1, in which receiving an analog signal includes receiving the analog signal from a photodetector.

8. The method of claim 1, in which receiving an offset compensation signal from compensation circuitry includes receiving the offset compensation signal from a digital to analog converter (DAC).

9. The method of claim 1, in which the deviation of the offset compensation signal is a positive or negative integer multiple of a resolution limit of the signal processing circuitry; and, optionally in which the deviation of the offset compensation signal is +1 least significant bit (LSB) of the signal processing circuitry, 0, or −1 LSB.

10. The method of claim 1, comprising performing a spectral analysis based on the scaled output signal.

11. A system for processing an analog signal, the system comprising:
  signal processing circuitry having a gain error;
  compensation circuitry configured to provide an offset compensation signal to the signal processing circuitry, the offset compensation signal having (i) a polarity opposite a polarity of the gain error of the signal processing circuitry and (ii) a magnitude equal to a nominal compensation value plus a deviation;
  the signal processing circuitry being configured to:
    generate an output signal based on a received analog signal, including applying the offset compensation signal to an intermediate signal generated by the signal processing circuitry; and
  one or more processors coupled to a memory, the one or more processors and memory configured to scale the output signal from the signal processing circuitry based on the deviation between the magnitude of the offset compensation signal and the nominal compensation value.

12. The system of claim 11, in which the one or more processors and memory are configured to scale the output signal based on the deviation and on a gain error coefficient of the compensation circuitry.

13. The system of claim 12, in which the gain error coefficient of the compensation circuitry comprises a ratio between a resolution limit of the signal processing circuitry and a gain of the signal processing circuitry.

14. The system of claim 12, in which the one or more processors and memory are configured to determine the gain error coefficient of the compensation circuitry, optionally in which the one or more processors and memory are configured to determine the gain error coefficient:
  using a lookup table relating gain error coefficients to corresponding gains of the signal processing circuitry; and/or
  by a measurement.

15. The system of claim 11, in which the one or more processors and memory are configured to determine the deviation between the magnitude of the offset compensation signal and the nominal compensation value.

16. The system of claim 11, in which the signal processing circuitry comprises one or more of:
  an analog-to-digital converter,
  an amplifier, and/or
  a delta sigma modulator.

17. The system of claim 11 comprising a sensor, optionally in which the sensor comprises a photodetector.

18. The system of claim 11, in which the compensation circuitry comprises a digital to analog converter (DAC).

19. A system for performing spectral analysis, the system comprising:
  a photodetector configured to output an analog signal responsive to receipt of an optical signal;
  a signal processing module comprising:
    signal processing circuitry having a gain error;
    compensation circuitry configured to provide an offset compensation signal to the signal processing circuitry, the offset compensation signal having (i) a polarity opposite a polarity of the gain error of the signal processing circuitry and (ii) a magnitude equal to a nominal compensation value plus a deviation;
    the signal processing circuitry being configured to:
      generate an output signal based on a received analog signal, including applying the offset compensation signal to an intermediate signal generated by the signal processing circuitry; and
    one or more processors coupled to a memory, the one or more processors and memory configured to:
      scale the output signal from the signal processing circuitry based on the deviation between the magnitude of the offset compensation signal and the nominal compensation value; and
      perform a spectral analysis based on the output signal.

20. The system of claim 19, in which performing a spectral analysis comprises performing an ambient color measurement.

21. The system of claim 19, in which the system comprises one or more of:
  a smart lighting system;
  an agricultural analysis system;
  a fluid analysis system; and/or
  a medical analysis system.

* * * * *